United States Patent
Heinsoo

(10) Patent No.: US 12,333,383 B2
(45) Date of Patent: Jun. 17, 2025

(54) ADDITIVE CONTROL OF QUBITS FOR ENABLING TIME-DOMAIN AND FREQUENCY-DOMAIN MUTIPLEXING

(71) Applicant: IQM Finland Oy, Espoo (FI)

(72) Inventor: Johannes Heinsoo, Espoo (FI)

(73) Assignee: IQM Finland Oy, Espoo (FI)

( * ) Notice: Subject to any disclaimer, the term of this patent is extended or adjusted under 35 U.S.C. 154(b) by 918 days.

(21) Appl. No.: 16/913,544

(22) Filed: Jun. 26, 2020

(65) Prior Publication Data

US 2021/0241159 A1 Aug. 5, 2021

(30) Foreign Application Priority Data

Feb. 4, 2020 (EP) .................................. 20155370

(51) Int. Cl.
- G06N 10/40 (2022.01)
- G06F 1/20 (2006.01)
- G06N 10/20 (2022.01)
- G11C 11/44 (2006.01)

(52) U.S. Cl.
CPC ............... *G06N 10/40* (2022.01); *G06F 1/20* (2013.01); *G06N 10/20* (2022.01); *G11C 11/44* (2013.01)

(58) Field of Classification Search
CPC ............................... G06N 10/00; G06N 10/40
See application file for complete search history.

(56) References Cited

U.S. PATENT DOCUMENTS

| 9,520,180 B1 | 12/2016 | Mukhanov et al. |
| 10,402,743 B1 | 9/2019 | Rigetti et al. |
| 2009/0014714 A1 | 1/2009 | Koch |
| 2016/0125311 A1* | 5/2016 | Fuechsle ............... H10N 60/80 257/31 |
| 2018/0348310 A1 | 12/2018 | Martinis |

(Continued)

FOREIGN PATENT DOCUMENTS

| CN | 101868802 A | 10/2010 |
| CN | 105071867 A | 11/2015 |
| CN | 107924490 A | 4/2018 |

(Continued)

OTHER PUBLICATIONS

Plourde, B. L. T., et al. "Flux qubits and readout device with two independent flux lines." Physical Review B—Condensed Matter and Materials Physics 72.6 (2005): 060506. (Year: 2005).*

(Continued)

*Primary Examiner* — Markus A. Vasquez

(74) *Attorney, Agent, or Firm* — Meunier Carlin & Curfman LLC

(57) ABSTRACT

A quantum electronics circuit comprises quantum circuit elements, control signal lines, and signal couplings therebetween for coupling at least some control signal lines with at least some quantum circuit elements. There are at least a first subset and a second subset of control signal lines. The signal couplings couple each of at least a subgroup of the quantum circuit elements with a respective control signal line of the first subset and a respective control signal line of the second subset. This enables additively controlling states of individual quantum circuit elements of the subgroup with mutually additive control signals transmitted through the respective control signal lines of the first and second subsets.

12 Claims, 3 Drawing Sheets

(56) References Cited

U.S. PATENT DOCUMENTS

2020/0111016 A1* 4/2020 Boothby .............. G06N 10/00

FOREIGN PATENT DOCUMENTS

| CN | 109494218 A | 3/2019 |
| CN | 212061223 | 12/2020 |
| EP | 3016034 | 5/2016 |

OTHER PUBLICATIONS

Extended European Search Report issued in EP20155370.8, dayed Jul. 27, 2020, 8 pages.
International Search Report issued to PCT/FI2021/050071, dated May 12, 2021, 6 pages.
Jerger, M et al. Frequency division multiplexing readout and simultaneous manipulation of an array of flux qubits. In: Applied Physics Letters, AIP Publishing, Jul. 23, 2012, vol. 101, 042604, XP012164086, <DOI:10.1063/1.4739454>.
Office Action in corresponding JP App. No. 2022-544443, mailed Oct. 15, 2024 (English-language translation, 5 pages).

* cited by examiner

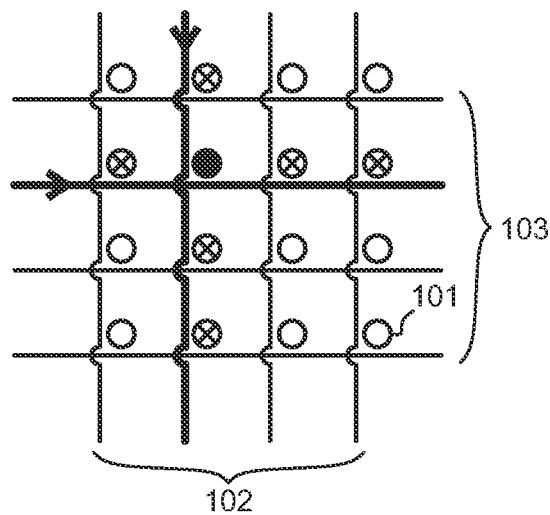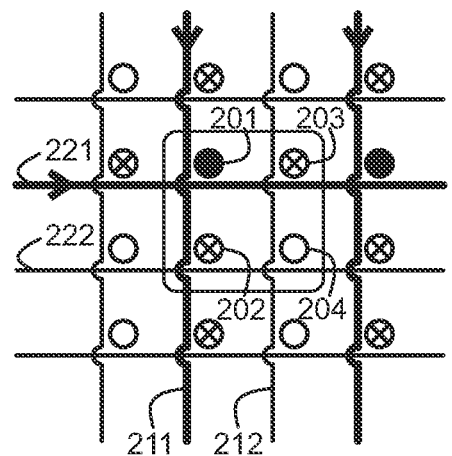
Fig. 1
Fig. 2
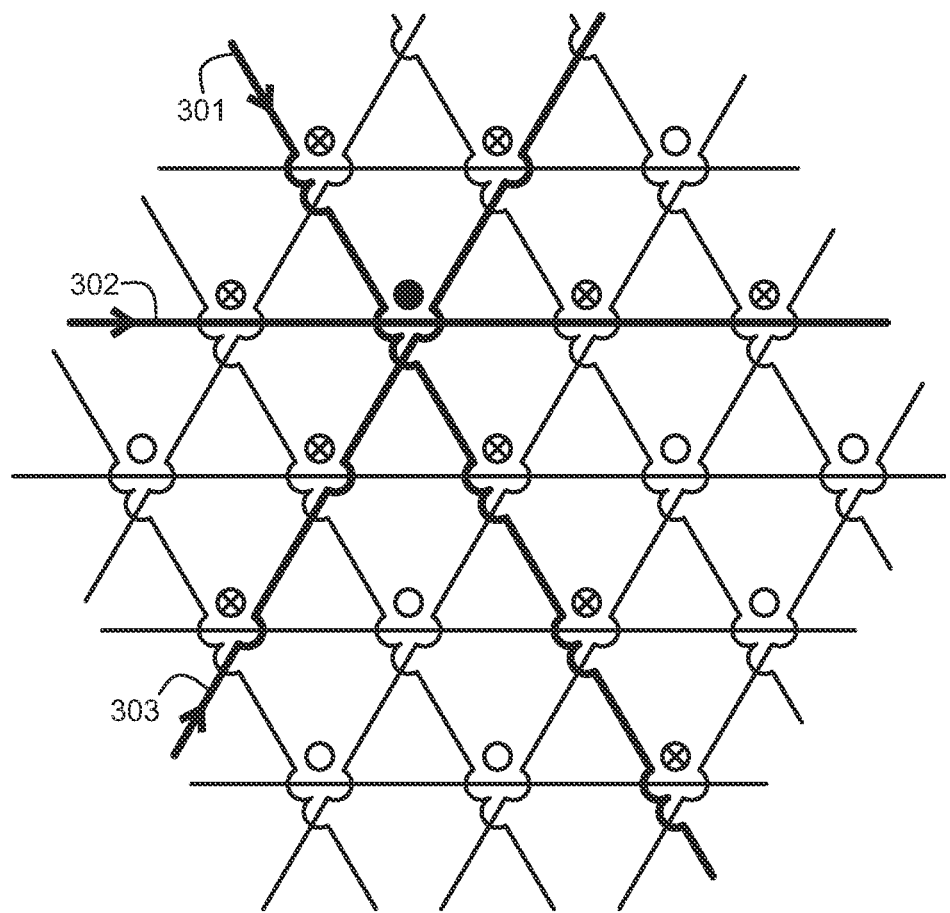
Fig. 3

ADDITIVE CONTROL OF QUBITS FOR ENABLING TIME-DOMAIN AND FREQUENCY-DOMAIN MUTIPLEXING

PRIORITY CLAIM

This application claims priority to European Patent Application No. 20155370.8, filed on Feb. 4, 2020, the entire disclosure of which is incorporated by reference herein.

TECHNICAL FIELD

The invention is generally related to the technology of quantum computing. In particular the invention is related to the technology of controlling the states of qubits, also referred to as quantum bits.

BACKGROUND

In quantum computing it has become common to use the term qubit to designate not only the basic unit of information but also the information storage element that is used to store one qubit of information. As an example, a superconducting memory circuit with one or more qubits (i.e. qubit-sized information storage elements) can be considered. In such an example the qubit is an anharmonic oscillator, such as a transmon, and it may be coupled to a nearby readout resonator for facilitating the readout of the state of the qubit stored therein.

To implement a quantum computer it is essential that the states of the qubits can be controlled with control signals coupled thereto. Controlling typically involves injecting a control signal into a control signal line that comes sufficiently close to a qubit, coupler, or linear resonator to allow the control signal interact with the state of the qubit. The control signal may come at a frequency close enough to a resonant frequency of the qubit or some associated circuit element. Alternatively, the control signal may comprise a DC pulse that creates a magnetic flux strong enough to bias a SQUID included in the qubit or the associated circuit element.

Quantum computing devices can only operate at extremely low temperature, meaning temperatures well below 1 kelvin, for which the device must be inside an advanced cryostat. Each signal line to and from the cryostat constitutes a heat load that makes it more difficult to achieve and maintain the required low temperature. Additionally, the signal lines need auxiliary devices like control electronics, amplifiers, filters, and the like, which involve expensive advanced technology, take considerable space, and add to the overall complicatedness of the arrangement. These problems become increasingly worse as the number of qubits in the quantum computing device increases.

SUMMARY

It is an objective to provide an arrangement and a method for controlling the states of qubits with control circuitry that is less complicated than in prior art. Another objective is to provide an arrangement and a method for controlling the state of qubits that decrease the number of signal lines and control equipment compared to previously known solutions. Another objective is that the arrangement and method are compatible with different types of qubits, and different kinds of controlled degrees of freedom. A further objective is to enable keeping the number of calibrated degrees of freedom of the control field sub-linearly dependent on the number of qubits or qubit couplers. A yet further objective is to enable building quantum computing devices in which the number of control lines grows slower than the number of qubits controlled by those control lines.

The objectives of the invention are achieved by utilizing additive control through multiple control lines, so that one or more qubits of choice can be addressed through the use of a suitably selected combination of control lines.

According to a first aspect there is provided a quantum electronics circuit comprising a plurality of quantum circuit elements, a plurality of control signal lines, and signal couplings between the control signal lines and the quantum circuit elements. The signal couplings are for coupling at least some of the control signal lines with at least some of the quantum circuit elements. The control signal lines comprise at least a first subset of control signal lines and a second subset of control signal lines. The signal couplings are arranged to couple each of at least a subgroup of the quantum circuit elements with a respective control signal line of the first subset and a respective control signal line of the second subset. This enables additively controlling states of individual quantum circuit elements of the subgroup with mutually additive control signals transmitted through the respective control signal line of the first subset and the respective control signal line of the second subset.

According to an embodiment of the first aspect the plurality of quantum circuit elements comprises a first, a second, a third, and a fourth quantum circuit element. The signal couplings are then arranged to couple a first control signal line of the first subset with the first and second quantum circuit elements, and a second control signal line of the first subset with the third and fourth quantum circuit elements. The signal couplings are then also arranged to couple a first control signal line of the second subset with the first and third quantum circuit elements, and a second control signal line of the second subset with the second and fourth quantum circuit elements.

According to an embodiment of the first aspect the signal couplings are arranged to couple the first control signal line of the first subset with a first subgroup of quantum circuit elements, including the first and second quantum circuit elements. The signal couplings are then also arranged to couple the second control signal line of said first subset with a second subgroup of quantum circuit elements, including the third and fourth quantum circuit elements. The signal couplings are then further arranged to couple each control signal line of the second subset to only one quantum circuit element of the first subgroup and only one quantum circuit element of the second subgroup.

According to an embodiment of the first aspect the signal couplings are arranged to couple each control signal line of said first subset with a respective subgroup of quantum circuit elements, and each control signal line of said second subset with only one quantum circuit element of each subgroup.

According to an embodiment of the first aspect the plurality of control signal lines comprises at least one further subset of control signal lines in addition to the first and second subsets of control signal lines. Within each of said subsets the signal couplings are then arranged to couple each individual control signal line to a respective subgroup of quantum circuit elements. Between the subsets the signal couplings are then also arranged to couple at most one of the quantum circuit elements of each subgroup to any control signal line belonging to a different subset.

According to an embodiment of the first aspect at least some of the quantum circuit elements are qubits.

According to an embodiment of the first aspect at least some of the quantum circuit elements are resonators from which further couplings exist to further resonators.

According to a second aspect there is provided a quantum electronics device that comprises at least one quantum electronics circuit of a kind described above, and a multichannel control signal source configured to selectively transmit control signals to the plurality of control signal lines.

According to an embodiment of the second aspect the multichannel control signal source is configured to control a state of an individual one of the plurality of quantum circuit elements by transmitting mutually additive control signals through those of the control signal lines with which the individual one of the plurality of quantum circuit elements is coupled through the signal couplings.

According to an embodiment of the second aspect the multichannel control signal source is configured to control states of individual ones of the plurality of quantum circuit elements by transmitting time multiplexed mutually additive control signals through those of the control signal lines with which the individual ones of the plurality of quantum circuit elements are coupled through the signal couplings.

According to an embodiment of the second aspect the multichannel control signal source is configured to control states of individual ones of the plurality of quantum circuit elements by transmitting frequency multiplexed mutually additive control signals through those of the control signal lines with which the individual ones of the plurality of quantum circuit elements are coupled through the signal couplings.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings:

FIG. 1 illustrates a rectangular array of qubits and control lines with control signals applied to two control lines, FIG. 2 illustrates a rectangular array of qubits and control lines with control signals applied to three control lines, FIG. 3 illustrates a hexagonal array of qubits and control lines with control signals applied to three control lines.

DETAILED DESCRIPTION

Figure 4:
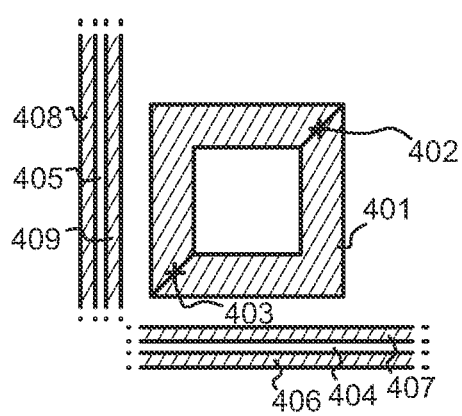
FIG. 4 illustrates a gradiometric qubit with two nearby control lines.

Throughout this text the term quantum circuit element includes any circuit element, or any combination of circuit elements, that can assume and maintain detectable quantum mechanical states for the purpose of taking part in quantum computing. Additionally, the term includes any circuit element, or any combination of circuit elements, that can be used in the same circuit to make further couplings to and/or from circuit elements capable of assuming and maintaining detectable quantum mechanical states. Examples of quantum circuit elements comprise but are not limited to qubits; couplers; resonators that are not qubits but can be used in same circuits as qubits; mixers that can be used in same circuits as qubits; and SQUIDs (superconducting quantum interference devices).

The term quantum electronics circuit is not limited to just electronic quantum circuits but covers also e.g. trapped ions, atoms, and such, as is known to the person skilled in the art.

FIG. 1 illustrates a quantum electronics circuit that comprises a plurality of quantum circuit elements and a plurality of control signal lines. The quantum circuit elements are shown schematically as circles; quantum circuit element 101 is singled out as an example. The control signals lines are shown schematically as straight lines, with small semicircular sections at the intersections emphasizing that the control signals lines shown as vertical lines do not connect with those shown as horizontal lines at the intersections. The intention is that control signals transmitted through one control signal line do not couple into the other control signal lines unless a dedicated coupling is provided for this purpose.

Signal couplings exist between the control signal lines and the quantum circuit elements in the circuit of FIG. 1. A signal coupling includes a part of the quantum electronics circuit where a signal can, and is intended to, cause an exchange of energy between a control signal line and a quantum circuit element. The signal couplings mentioned above can thus be described to exist for the purpose of coupling at least some of the control signal lines with at least some of the quantum circuit elements.

A signal coupling can be created as simply as making a control signal line pass sufficiently close to the quantum circuit element with which it should have a signal coupling, for example on the surface of a common substrate on which they both are built. Additionally or alternatively a signal coupling may comprise dedicated coupling elements, as is well known in the technical field of quantum electronics.

The plurality of control signal lines comprises a first subset 102 of control signal lines, shown as vertical lines in FIG. 1, and a second subset 103 of control signal lines, shown as horizontal lines in FIG. 1. The signal couplings mentioned above are arranged to couple each of at least a subgroup of the quantum circuit elements with a respective control signal line of the first subset 102 and a respective control signal line of the second subset 103. In FIG. 1 each vertical control signal line is assumed to have signal couplings with each of the quantum circuit elements in the vertical column on the immediate right side of the vertical control signal line. Similarly, each horizontal control signal line is assumed to have signal couplings with each of the quantum circuit elements in the horizontal row immediately above the horizontal control signal line. The larger distances from the control signals lines to all other quantum circuit elements mean that there are no signal couplings of significant magnitude therebetween.

The number of control signal lines in a subset can be anything, depending on the number of qubits and the relative arrangement of the qubits and control signal lines. Even only a single control signal line may be considered to form its own subset in some embodiments.

This mutual arrangement of quantum circuit elements and control signal lines enables additively controlling states of individual quantum circuit elements with mutually additive control signals transmitted through the respective control signal lines. Control signals being mutually additive does not necessarily mean only linear additivity, but in general control signals the effect of which on a particular qubit may add up in the way described in this text.

As an example, the pair of control signal lines illustrated as the thicker vertical line of the first subset 102 and the thicker horizontal line of the second subset 103 is considered in FIG. 1. Alone, the control signal transmitted through the selected vertical control signal line is too weak, not correctly tuned, and/or otherwise not capable of effectively controlling the states of any of the quantum circuit elements with which it has signal couplings. Similarly, alone, the control signal transmitted through the selected horizontal control signal line is too weak, not correctly tuned, and/or otherwise not capable of effectively controlling the states of any of the quantum circuit elements with which it has signal couplings. However, the quantum circuit element that has signal couplings with both the selected vertical control signal line and the selected horizontal control signal line experiences the simultaneous influence of the both control signals transmitted through said selected control signal lines. The effect of the two control signals add up at this quantum circuit element; hence the designation "additive" control of its state.

For additive control with magnetic field flux, the signal that flows through any individual control signal line is an electric current. The signal causes qubit detuning, which in turn is measured in flux quanta. A typical "on-signal" may be for example in the order of 0.2 flux quanta, and an "on-signal tolerance" may be in the order of 0.01 flux quanta. A non-effecting partial signal, which in the present context might be caused by the control signal flowing only through a single control signal line, could be in the order of 0.1 flux quanta, being well out of the "on-signal tolerance" range. Thus it would not trigger a gate, i.e. a meaningful change in the state of a qubit.

For additive control with RF waveforms the signal amplitude is measured for example as peak to peak voltage, and consequently measured in volts. The effect on the qubit is determined by the mutual capacitance of the signal line and qubit, by signal amplitude and by signal frequency. In this case, an "on-signal" may consist of for example two off-resonant pulses with a sum of frequencies corresponding to the qubit frequency for resonant driving, for example 3 GHZ and 2 GHz tones for qubit with 5 GHz frequency. The "on-signal frequency range" is inversely proportional to the gate duration. Typical gates are 10 ns long with corresponding spectral width of roughly 100 MHz. For a qubit that sees only a 2 or 3 GHz signal the detuning between the drive and qubit frequencies is much larger than the spectral width of the pulse. In the case of off-resonant driving the qubit only experiences a small "AC Stark (frequency) shift" which causes a small predictable single qubit phase error.

In all described additive control methods, the "perturbed" qubits that are not currently targeted do, however, experience a small side-effect of a phase change of the qubit by some fixed amount. This can be compensated for with for example a known method called "virtual z gates." A virtual z-gate is implemented by updating the reference frame that defines the phase of subsequent control pulses. In general, the phase of a qubit is defined relative to an arbitrary reference frame, which means that one can define a (virtual) zgate by redefining the reference frame, for example, by changing the phase of all subsequent physical pulses to follow, while the phase of the "logical gates" does not change. Updating the reference frame is possible if all the qubits live in an independent reference frame. This in turn may require that any multi-qubit gates commute with single qubit phase gates (commuting means that the order of operations does not matter). In the context of the present description, this requirement can be fulfilled for example by using c-phase gates, as they are known to commute with single-qubit phase gates.

In FIG. 1 the quantum circuit elements marked with an X inside the circle are those that have signal couplings with exactly one of the selected control signal lines. These quantum circuit elements may be described as being perturbed, but not being significantly affected by the control signal transmitted through the one of the selected control signal lines. The quantum circuit element marked with a solid black circle is the one that has signal couplings with both of said selected control signal lines, to that it will be properly affected by the additive effect of the control signals transmitted through the respective two control lines. The quantum circuit elements marked with plain white circles can be described as idling.

FIG. 2 illustrates the same quantum electronic circuit, this time with two of the vertical control signal lines selected simultaneously with the one horizontal control signal line. The transmission of control signals through the two selected vertical control signal lines and through the selected horizontal control signal line leads to additively controlling the states of the two individual quantum circuit elements marked with solid black circles in FIG. 2. There is a total of 8 quantum circuit elements, each marked with an X inside the circle in FIG. 2, that have signal couplings with exactly one of the selected control signal lines. Just like in FIG. 1, the effect of the control signal transmitted through only one control signal line is too weak, not correctly tuned, and/or otherwise not capable of providing any substantial control of the state of these quantum circuit elements; they are just perturbed. There are ways to deal with this perturbation in a local manner without influencing the rest or the circuit and multiplexing strategy.

The relations and couplings between control signal lines and quantum circuit elements can be described for example in the following way, using the reference designators in FIG. 2. The plurality of quantum circuit elements comprises a first 201, a second 202, a third 203, and a fourth 204 quantum circuit element. There is a first control signal line 211 of the first subset, and a second control signal line 212 of the first subset. Similarly there is a first control signal line 221 of the second subset, and a second control signal line 222 of the second subset. The signal couplings are arranged to couple the first control signal line 211 of the first subset with the first 201 and second 202 quantum circuit elements, and the second control signal line 212 of said first subset with the third 203 and fourth 204 quantum circuit elements. Additionally said signal couplings are arranged to couple the first control signal line 221 of the second subset with the first 201 and third 203 quantum circuit elements, and the second control signal line 222 of the second subset with the second 202 and fourth 204 quantum circuit elements.

A yet another way to describe the matrix of quantum circuit elements, control signal lines, and couplings is the following. The signal couplings are arranged to couple the first control signal line 211 of the first subset with a first subgroup of the quantum circuit elements, including the first 201 and second 202 quantum circuit elements. The signal couplings are also arranged to couple the second signal line 212 of the first subset with a second subgroup of quantum circuit elements, including the third 203 and fourth 204 quantum circuit elements. The signal couplings are arranged to couple each control signal line of the second subset to only one quantum circuit element of the first subgroup 201, 202 and only one quantum circuit element of the second subgroup 203, 204.

This last-mentioned definition can be generalized by saying that the signal couplings are arranged to couple each control signal line of the first subset with a respective subgroup of quantum circuit elements, and each control signal line of the second subset with only one quantum circuit element of each such subgroup.

The principle of additive control of quantum circuit elements can be implemented with more than just two subsets of control signal lines. FIG. 3 illustrates one alternative, in which the quantum circuit elements constitute a hexagonal pattern, for example on a surface of a common substrate. The plurality of control signal lines comprises at least one further subset of control signal lines in addition to the first and second subsets of control signal lines. Here each of the three subsets of control signals lines comprises mutually parallel control signal lines, and the subsets are oriented at 60 degrees intervals with respect to each other. Thickened lines in FIG. 3 illustrate the simultaneous transmission of control signals through a control signal line 301 of the first subset, a control signal line 302 of the second subset, and a control signal line 303 of the third subset.

Similar to FIGS. 1 and 2, also in the embodiment of FIG. 3 within each subset of control signal lines the signal couplings are arranged to couple each individual control signal line to a respective subgroup of quantum circuit elements. Between the subsets, the signal couplings are arranged to couple at most one of the quantum circuit elements of each subgroup to any control signal line belonging to a different subset.

The graphical notation used for the quantum circuit elements in FIG. 3 is also the same as in FIGS. 1 and 2. A quantum circuit element to which no control signal is even partially coupled is marked with a solid white circle. A quantum circuit element that has some coupling with a control signal line through which a control signal is transmitted, but not enough to affect the state of the quantum circuit element, is marked with a circle with an X in it. A quantum circuit element that has sufficient couplings to multiple control signal lines through which control signals are simultaneously transmitted, resulting in additive control of such a quantum circuit element, is marked with a black circle. The use of three or more distinct subsets of control signal lines may help to ensure better resolution between the control signal coupling caused by only one (or just a few) control signal line and that caused by all those control signals lines, the intended effect of which is additive control of the quantum circuit element to which they are all coupled. Advantages of using three or more distinct subsets of control signal lines may also involve smaller perturbation of the perturbed qubits, and/or reduced number of independent control lines.

Another approach that can be alternatively or additionally used to implement the control signal lines in more than two subsets is one in which not all quantum circuit elements need to be able to be addressed through one subset. Namely, a feature common to all FIGS. 1, 2, and 3 is that among each individual subset of control signal lines there can be found one control signal line that has a coupling with any arbitrarily selected one of the quantum circuit elements. As said, this is not a requirement; for example, in FIGS. 1 and 2 one could define that the top two horizontal control signal lines belong to one subset and the bottom two horizontal control signal lines belong to another subset. For implementing additive control, it is only necessary to ensure that each of those quantum circuit elements for which additive control is to be applied can be simultaneously addressed with selected control signal lines from two or more subsets.

The approach illustrated in FIGS. 1 and 2, in which control signals transmitted simultaneously through exactly two control signal lines are needed for additive control of any desired quantum circuit element, means that if the number of quantum circuit elements is $N^2$, the number of control signal lines is 2N. Attempting to build larger and larger quantum computing devices means that N becomes bigger and bigger, but the number of control signal lines (2N) grows slower in relation to N than the number of quantum circuit elements ($N^2$) as a function of N. Thus, one of the objectives mentioned earlier is clearly fulfilled. In the approach illustrated in FIG. 3 if the quantum circuit elements constitute a regular hexagonal pattern, each side of which has N quantum circuit elements (N=3 in FIG. 3), it can be shown that the same aim is fulfilled: the total number of quantum circuit elements is 2 [N+sigma (N+i)]−1, where the summing index i in the sum "sigma (N+i)" goes from zero to N−2. This expression grows significantly faster as a function of N than the total number 3(2N−1) of control signal lines. It should be noted, though, that also in the hexagonal grid of FIG. 3 it would be possible to control all qubits with just two of the subsets of control signal lines, which would be even more in numbers than the three subsets illustrated in FIG. 3.

The manufacturing methods that are readily available for manufacturing quantum electronics circuits are such that in most cases the quantum circuit elements and control signal lines constitute an essentially two-dimensional structure, i.e. they are located essentially in a single plane, typically on a planar surface of a substrate. This is not a requirement, but the structure can be also essentially three-dimensional, which gives even more freedom to selecting the topology of the array of quantum circuit elements and the way in which the control signal lines are brought sufficiently close to them to provide for the signal couplings. The objective of making the number of control lines grow slower than the number of qubits controlled by those control lines can be achieved also in three-dimensional structures. For example, if the quantum circuit elements constitute a regular, three-dimensional, cubic array with N quantum circuit elements on each edge thereof, the number of quantum circuit elements is $N^3$, which grows faster as a function of N than the number 3N2 of control signal lines. In this example it may be assumed that the control signal lines penetrating the cubic array of quantum circuit elements are straight and arranged in three subsets, each oriented along one of the three mutually orthogonal coordinate axes. Also in this example, for additive control of a desired quantum circuit element it may be assumed that simultaneous control signals are transmitted through a selected one control signal line from each of the three subsets. The desired quantum circuit element is the one closest to where these three control signal lines meet.

Also the strictly regular arrangement of the quantum circuit elements, with constant mutual intervals and constant mutual directions, is not a requirement. Quantum circuit elements, the states of which are to be controlled with additive control, can be arranged in any geometry that is advantageous for some reason, for example related to their manufacturing method and/or their desired mutual interactions or the required absence thereof during operation. Also, it is not a requirement that all quantum circuit elements in the quantum electronics device are included in the additive control scheme, but there can be others that have e.g. dedicated, individual control signal lines of their own.

Since the transmission of control signals through one set of selected control signal lines causes an additive control effect on only one or only some of the quantum circuit elements, in order to take advantage of the full quantum processing power of the quantum electronics device it may be necessary to perform time multiplexing. This means that different ones (and/or different subgroups) of the quantum circuit elements are selected for additive control sequentially, at different moments of time. The aspect of time multiplexing is considered in more detail later in this text. The application of time multiplexing does not exclude other forms of multiplexing in controlling the quantum circuit elements, such as frequency multiplexing in which control signals of different frequencies are used.

The effect of the control signals on the quantum circuit elements can be called the control field. Examples of how the control signal may affect the state of the quantum circuit element include but are not limited to the electric field due to the signal charge biasing a qubit, the magnetic field due to the signal magnetic field flux biasing a SQUID. The calibrating of the control operations is preferably scalable in the sense that the number of calibrated degrees of freedom of the control field should be at most polynomial in the number of quantum circuit elements. Otherwise calibration may become excessively complicated or infeasible for large numbers of quantum circuit elements.

FIGS. 4 to 7 illustrate non-limiting examples of quantum circuit elements and their couplings to control signal lines. In these figures it is assumed that components of a quantum electronics device are formed on the surface of an insulating substrate, large areas of which are covered with a layer of a conductive material that becomes superconductive when the device is cooled down to the temperatures required for the proper operation of the quantum circuit elements. The hatched portions in these drawings represent areas with no corresponding layer of conductive material, i.e. areas where the pure surface of the chip substrate is visible. The substrate material may be for example silicon or sapphire, and the conductive regions may be areas covered with superconductive material, deposited on the surface of the substrate with a suitable thin film deposition method. Non-conductive regions may be areas of the substrate surface where no superconducting material or any other material was deposited.

The quantum circuit element illustrated in FIG. 4 is a gradiometric qubit in which the area with no conductive material is a square-shaped ring 401. Two Josephson junctions 402 and 403 bridge the diagonally opposite corners of the square-shaped ring 401. Two coplanar waveguides are located close to respective sides of the square-shaped ring 401, each of them comprising a central conductor 404 or 405 separated from the surrounding conductive plane by strip-formed areas 406, 407, 408, or 409 void of conductive material. This kind of structure enables biasing the gradiometric qubit with a magnetic field flux bias by utilizing suitable control signals. How the control lines, parts of which are the coplanar waveguides shown in FIG. 4, continue further from the quantum circuit element is of no importance; it is sufficient to assume that their structure and location enables simultaneous transmission of control signals through both of them for additive control of the quantum circuit element.

Figure 5:
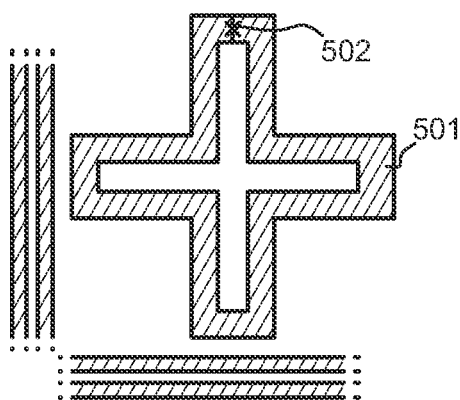
FIG. 5 illustrates an X-shaped qubit with two nearby control lines.

The quantum circuit element illustrated in FIG. 5 is an X-shaped qubit in which the area with no conductive material is a ring 501 with the shape of an X. A Josephson junction 502 bridges the ring at the outer end of one of the branches of the X. The appearance of the control signal lines is similar to that of FIG. 4: two coplanar waveguides are located close to respective outer ends of branches of the X-shaped ring 501. These branches do not include that branch where the Josephson junction 502 is located. The structure enables charge biasing the X-shaped qubit by utilizing suitable control signals transmitted through control signal lines, respective parts of which are constituted by the two coplanar waveguides.

Figure 6:
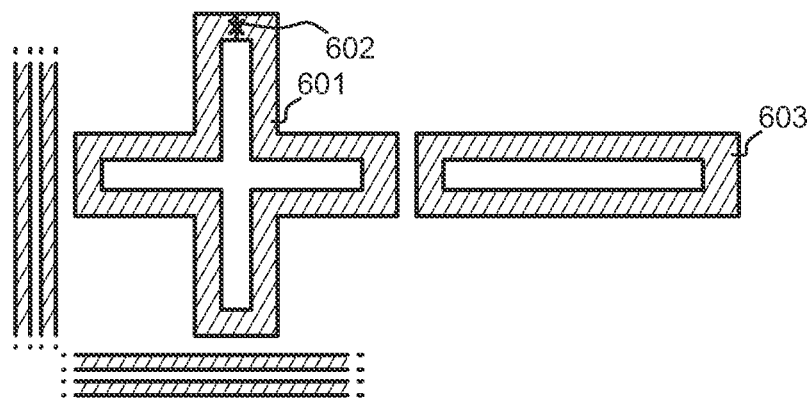
FIG. 6 illustrates an X-shaped non-linear resonator used as a mixer for two-tone drive of a linear resonator coupled to it, with two nearby control lines.

The quantum circuit element illustrated in FIG. 6 comprises a structure similar to that in FIG. 5 with an X-shaped ring 601 of no conductive material and a Josephson junction 602 bridging the ring at the outer end of one branch. Control signal lines appear as sections of coplanar waveguides close to the outer ends of two of the three other branches. Close to the outer end of the remaining branch is a further, longitudinal ring 603 of no conductive material. In this structure the X-shaped ring 601 with its Josephson junction 602 constitute a nonlinear resonator that can be used as a mixer for two-tone drive of the linear resonator constituted by the longitudinal ring 603 of no conductive material. The structure enables charge biasing the X-shaped nonlinear resonator by utilizing suitable control signals transmitted through control signal lines, respective parts of which are constituted by the two coplanar waveguides.

Figure 7:
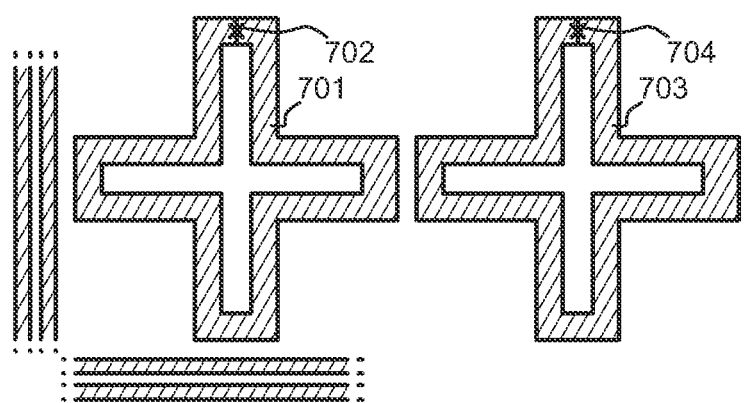
FIG. 7 illustrates an X-shaped non-linear resonator used as a mixer for two-tone drive of a qubit coupled to it, with two nearby control lines.

The quantum circuit element illustrated in FIG. 7 comprises a structure similar to that in FIGS. 5 and 6 with an X-shaped ring 701 of no conductive material and a Josephson junction 702 bridging the ring at the outer end of one branch. Control signal lines appear as sections of coplanar waveguides close to the outer ends of two of the three other branches. Close to the outer end of the remaining branch is a further, X-shaped ring 703 of no conductive material with a further Josephson junction 704 bridging it at the outer end of one of its branches. In this structure the left X-shaped ring 701 with its Josephson junction 702 constitute a nonlinear resonator that can be used as a mixer for two-tone drive of the qubit constituted by the right X-shaped ring 703 of no conductive material with its Josephson junction 704. The structure enables charge biasing the left X-shaped nonlinear resonator by utilizing suitable control signals transmitted through control signal lines, respective parts of which are constituted by the two coplanar waveguides.

Figure 8:
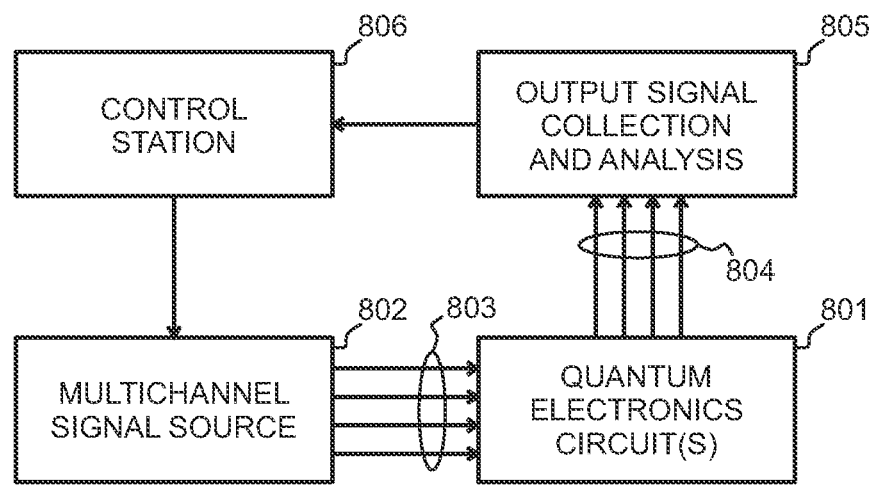
FIG. 8 illustrates a quantum electronics device that comprises one or more quantum electronic circuits.

FIG. 8 illustrates a quantum electronics device that comprises one or more quantum electronic circuits 801, which in turn may comprise an arbitrary number of quantum circuit elements of the kind described above, at least some of them configured for additive control through two or more control signal lines. The quantum electronics device comprises a multichannel control signal source 802 configured to selectively transmit control signals to the plurality of control signal lines 803 that connect the multichannel control signal source 802 to the quantum electronics circuit(s) 801. In particular, the selectivity applied by the multichannel control signal source 802 in transmitting the control signals may comprise transmitting some of the control signals simultaneously, for additive control of that or those quantum circuit elements to which there are signal couplings from the control signal lines utilized by the multichannel control signal source 802 to transmit the simultaneous control signals. The selectivity applied by the multichannel control signal source 802 in transmitting the control signals may also comprise multiplexing in time, frequency, or other quantity, so that such multiplexing separates from each other those control signals and/or combinations of simultaneous control signals that are to affect the states of quantum circuit elements independently of each other.

A set of further signal lines 804 connects the quantum electronics circuit(s) 801 to a further functional block 805 that performs at least the collection of output signals from the quantum electronics circuit(s) 801. At least some further analysis of the collected output signals may also take place in the functional block 805. A control station 806 is provided for controlling the operation of the multichannel signal source 802 and for providing the final processed output that represents the information content carried by the output signals from the quantum electronics circuit(s) 801.

Figure 9:
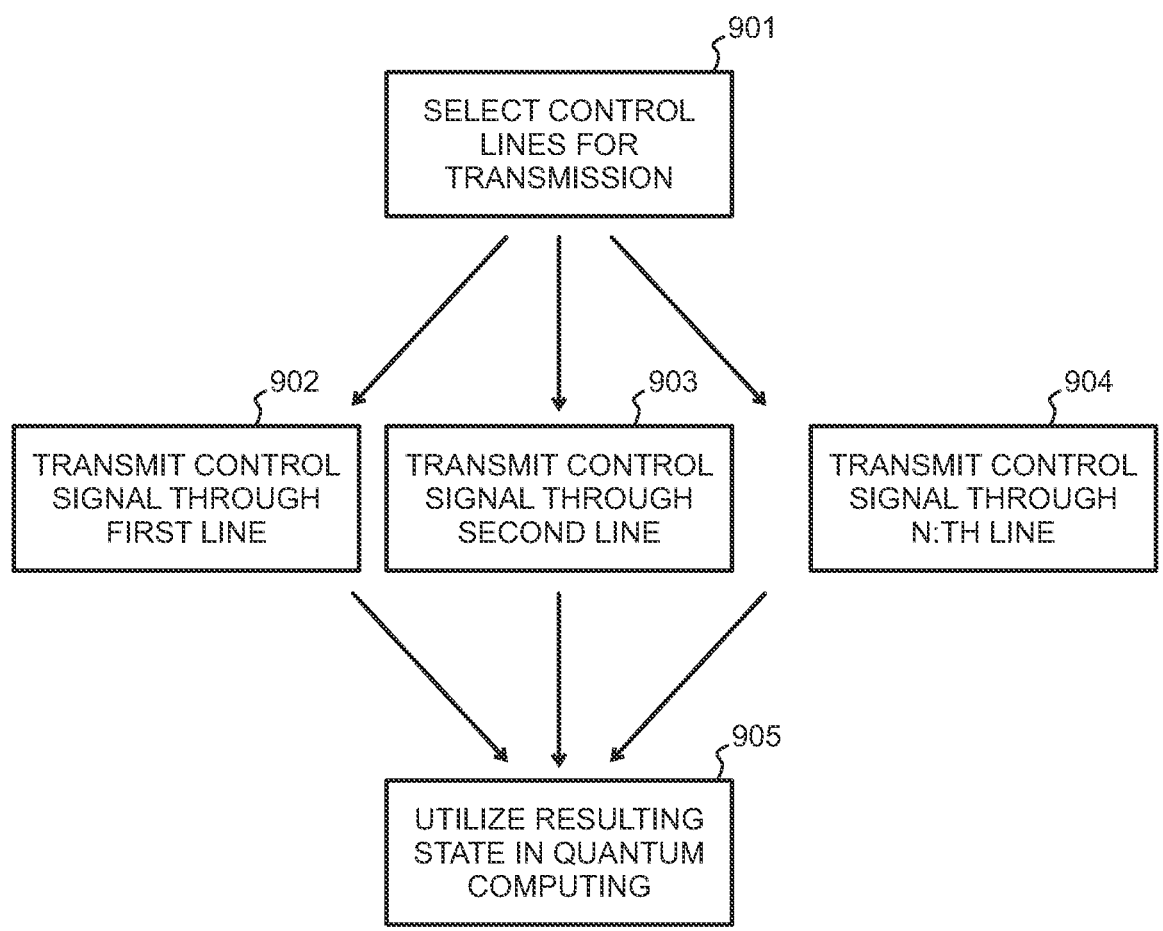
FIG. 9 illustrates a method.

FIG. 9 illustrates a method for additive control of at least one quantum circuit element. Step 901 represents forming control signals for simultaneous transmission through at least two control signal lines, and selecting the control signals lines through which these are to be transmitted. The selection of control signal lines is done on the basis of deciding, which quantum circuit element is the one, the state of which is to be affected by the control signals. Steps 902, 903, and 904 represent the simultaneous transmitting of the control signals through the selected control signal lines. Step 905 represents in general all possible ways of utilizing the resulting state of the quantum circuit element in question for any purpose in quantum computing. If virtual z-gates need to be applied and/or any other corrective measures need to be taken in order to take the perturbation of non-affected qubits into account, these corrective measures are also part of step 905 in the method.

It is obvious to a person skilled in the art that with the advancement of technology, the basic idea of the invention may be implemented in various ways. The invention and its embodiments are thus not limited to the examples described above, instead they may vary within the scope of the claims.

The invention is claimed as follows:

1. A quantum electronics circuit comprising:
a plurality of quantum circuit elements;
a plurality of control signal lines; and
signal couplings between said control signal lines and said quantum circuit elements, for coupling at least some of said control signal lines with at least some of said quantum circuit elements,
wherein said plurality of control signal lines comprises at least a first subset of control signal lines and a second subset of control signal lines, and
wherein said signal couplings are arranged to couple each of at least a subgroup of said quantum circuit elements with a respective control signal line of said first subset and a respective control signal line of said second subset, for enabling additively controlling quantum mechanical states of individual quantum circuit elements of said subgroup with a plurality of mutually additive control signals transmitted through the respective control signal line of said first subset and the respective control signal line of said second subset, wherein the plurality of mutually additive control signals are, in combination, configured to affect the quantum mechanical states of individual quantum circuit elements of said subgroup, and wherein the plurality of mutually additive control signals are all of a same type and comprise either: (i) direct current (DC) pulses for creating a magnetic flux, the DC pulses resulting in a combined flux quanta that is greater than or equal to a predetermined on-signal threshold of the individual quantum circuit elements of said subgroup, or (ii) radiofrequency (RF) waveforms having a combined frequency that is within a predetermined frequency range of a resonant frequency of the individual quantum circuit elements of said subgroup.

2. The quantum electronics circuit according to claim 1, wherein:
said plurality of quantum circuit elements comprises a first, a second, a third, and a fourth quantum circuit element,
said signal couplings are arranged to couple a first control signal line of said first subset with the first and second quantum circuit elements, and a second control signal line of said first subset with the third and fourth quantum circuit elements, and
said signal couplings are arranged to couple a first control signal line of said second subset with the first and third quantum circuit elements, and a second control signal line of said second subset with the second and fourth quantum circuit elements.

3. The quantum electronics circuit according to claim 2, wherein:
said signal couplings are arranged to couple the first control signal line of said first subset with a first subgroup of quantum circuit elements, including the first and second quantum circuit elements,
said signal couplings are arranged to couple the second control signal line of said first subset with a second subgroup of quantum circuit elements, including the third and fourth quantum circuit elements, and
said signal couplings are arranged to couple each control signal line of the second subset to only one quantum circuit element of the first subgroup and only one quantum circuit element of the second subgroup.

4. The quantum electronics circuit according to claim 3, wherein said signal couplings are arranged to couple each control signal line of said first subset with a respective subgroup of quantum circuit elements, and each control signal line of said second subset with only one quantum circuit element of each subgroup.

5. The quantum electronics circuit according to claim 4, wherein:
the plurality of control signal lines comprises at least one further subset of control signal lines in addition to the first and second subsets of control signal lines,
within each of said subsets, said signal couplings are arranged to couple each individual control signal line to a respective subgroup of quantum circuit elements, and
between said subsets, said signal couplings are arranged to couple at most one of the quantum circuit elements of each subgroup to any control signal line belonging to a different subset.

6. The quantum electronics circuit according to claim 1, wherein at least some of said quantum circuit elements are qubits.

7. The quantum electronics circuit according to claim 1, wherein at least some of said quantum circuit elements are resonators from which further couplings exist to further resonators.

8. The quantum electronics circuit of claim 1, wherein the plurality of mutually additive control signals, individually, perturb the individual quantum circuit elements of said subgroup but do not affect the quantum mechanical states of the individual quantum circuit elements of said subgroup.

9. A quantum electronics device comprising:
at least one quantum electronics circuit comprising a plurality of quantum circuit elements;
a plurality of control signal lines;
signal couplings between said control signal lines and said quantum circuit elements, for coupling at least some of said control signal lines with at least some of said quantum circuit elements; and a multichannel control signal source configured to selectively transmit control signals to said plurality of control signal lines, wherein said plurality of control signal lines comprises at least a first subset of control signal lines and a second subset of control signal lines, and wherein said signal couplings are arranged to couple each of at least a subgroup of said quantum circuit elements with a respective control signal line of said first subset and a respective control signal line of said second subset, for enabling additively controlling quantum mechanical states of individual quantum circuit elements of said subgroup with a plurality of mutually additive control signals transmitted through the respective control signal line of said first subset and the respective control signal line of said second subset, wherein the plurality of mutually additive control signals are, in combination, configured to affect the quantum mechanical states of individual quantum circuit elements of said subgroup, and wherein the plurality of mutually additive control signals are all of a same type and comprise either: (i) direct current (DC) pulses for creating a magnetic flux, the DC pulses resulting in a combined flux quanta that is greater than or equal to a predetermined on-signal threshold of the individual quantum circuit elements of said subgroup, or (ii) radiofrequency (RF) waveforms having a combined frequency that is within a predetermined frequency range of a resonant frequency of the individual quantum circuit elements of said subgroup.

10. The quantum electronics device according to claim 9, wherein the multichannel control signal source is configured to control a state of an individual one of the plurality of quantum circuit elements by transmitting mutually additive control signals through those of said control signal lines with which said individual one of the plurality of quantum circuit elements is coupled through said signal couplings.

11. The quantum electronics device according to claim 9, wherein the multichannel control signal source is configured to control states of individual ones of the plurality of quantum circuit elements by transmitting time multiplexed mutually additive control signals through those of said control signal lines with which said individual ones of the plurality of quantum circuit elements are coupled through said signal couplings.

12. The quantum electronics device according to claim 9, wherein the multichannel control signal source is configured to control states of individual ones of the plurality of quantum circuit elements by transmitting frequency multiplexed mutually additive control signals through those of said control signal lines with which said individual ones of the plurality of quantum circuit elements are coupled through said signal couplings.

* * * * *